US009367391B2

(12) United States Patent
Lam

(10) Patent No.: US 9,367,391 B2
(45) Date of Patent: Jun. 14, 2016

(54) ERROR CORRECTION OPERATIONS IN A MEMORY DEVICE

(71) Applicant: Micron Technology, Inc., Boise, ID (US)

(72) Inventor: William Lam, Pleasanton, CA (US)

(73) Assignee: Micron Technology, Inc., Boise, ID (US)

( * ) Notice: Subject to any disclaimer, the term of this patent is extended or adjusted under 35 U.S.C. 154(b) by 142 days.

(21) Appl. No.: 14/189,375

(22) Filed: Feb. 25, 2014

(65) Prior Publication Data

US 2014/0281808 A1  Sep. 18, 2014

Related U.S. Application Data

(60) Provisional application No. 61/788,906, filed on Mar. 15, 2013.

(51) Int. Cl.
*G11C 29/00* (2006.01)
*G06F 11/10* (2006.01)

(52) U.S. Cl.
CPC .................................. *G06F 11/1048* (2013.01)

(58) Field of Classification Search
None
See application file for complete search history.

(56) References Cited

U.S. PATENT DOCUMENTS

| | | | | |
|---|---|---|---|---|
| 5,532,962 A | * | 7/1996 | Auclair | G06F 11/1008 365/184 |
| 5,909,449 A | * | 6/1999 | So | B64C 27/006 714/721 |
| 7,224,607 B2 | | 5/2007 | Gonzalez et al. | |
| 7,447,847 B2 | | 11/2008 | Louie et al. | |
| 7,770,079 B2 | | 8/2010 | Radke et al. | |
| 7,882,314 B2 | | 2/2011 | Allison et al. | |
| 8,060,798 B2 | | 11/2011 | Roohparvar et al. | |
| 8,295,095 B2 | | 10/2012 | Jones | |
| 8,929,140 B2 | | 1/2015 | Nagashima | |
| 2009/0204871 A1 | * | 8/2009 | Eggleston | G06F 11/1008 714/763 |
| 2010/0124119 A1 | * | 5/2010 | Lee | G11C 8/08 365/185.18 |
| 2010/0174845 A1 | * | 7/2010 | Gorobets | G06F 12/0246 711/103 |
| 2010/0332952 A1 | | 12/2010 | Chung | |
| 2011/0289385 A1 | | 11/2011 | Takeuchi et al. | |
| 2011/0289386 A1 | | 11/2011 | Yang | |
| 2012/0204077 A1 | | 8/2012 | D'Abreu et al. | |
| 2012/0254519 A1 | | 10/2012 | Ellis | |
| 2013/0031429 A1 | | 1/2013 | Sharon et al. | |
| 2013/0073924 A1 | * | 3/2013 | D'Abreu | G06F 11/1048 714/763 |
| 2013/0268719 A1 | | 10/2013 | Dover et al. | |
| 2014/0254262 A1 | * | 9/2014 | Chen | G11C 16/0483 365/185.03 |
| 2014/0254271 A1 | * | 9/2014 | Lee | G11C 16/26 365/185.11 |

OTHER PUBLICATIONS

Taiwan Office Action for TW Application No. 103109248 mailed Jul. 29, 2015 (6 Pages).

* cited by examiner

*Primary Examiner* — Daniel McMahon
(74) *Attorney, Agent, or Firm* — Dicke, Billig & Czaja, PLLC

(57) ABSTRACT

Memory devices configured to determine if an error exists in read data and to respond to determined errors, as well as methods of operating such memory devices. In at least one embodiment, an internal controller of a memory device periodically performs internal error correction operations on stored user data and corrects user data in the memory device independently from instructions from an external memory access device. In further memory devices, an internal controller performs internal error correction operations on stored user data and adjusts trim values that define voltages to be utilized during a read operation in response to determining that the read user data comprises an error.

41 Claims, 7 Drawing Sheets

ERROR CORRECTION OPERATIONS IN A MEMORY DEVICE

RELATED APPLICATIONS

This application claims priority to U.S. Provisional Application Ser. No. 61/788,906, filed Mar. 15, 2013, titled "ERROR CORRECTION OPERATIONS IN A MEMORY DEVICE," incorporated herein by reference in its entirety.

TECHNICAL FIELD

The present disclosure relates generally to memory and in particular, in one or more embodiments, the present disclosure relates to error correction in memory devices.

BACKGROUND

Memory devices are typically provided as internal, semiconductor, integrated circuits in computers or other electronic systems. There are many different types of memory including random-access memory (RAM), read only memory (ROM), dynamic random access memory (DRAM), synchronous dynamic random access memory (SDRAM), resistive random access memory (RRAM), double data rate memory (DDR), low power double data rate memory (LPDDR), phase change memory (PCM) and Flash memory.

Non-volatile memory is memory that can retain its stored data for some extended period without the application of power. Flash memory devices have developed into a popular source of non-volatile memory for a wide range of electronic applications. Flash memory devices are commonly used in electronic systems, such as personal computers, personal digital assistants (PDAs), digital cameras, digital media players, digital recorders, games, appliances, vehicles, wireless devices, cellular telephones, and removable memory modules, and the uses for Flash memory continue to expand.

Memory devices typically perform memory operations such as reading, writing and erasing operations. These operations are sometimes referred to as foreground operations as these operations are sometimes initiated by a memory access device, such as a host, or other memory device controlling circuitry coupled to the memory device. Additional operations include what are sometimes referred to as background operations. These operations are sometimes initiated by controlling circuitry in a memory device itself. Wear-leveling in memory devices might be performed as a background operation, for example.

Recognizing that errors might occur in reading of data from the memory device, one or more types of error correction methods might be employed. Error Correction Schemes, commonly referred to as error correction codes (ECC), can be implemented in order to detect and attempt to correct these errors. Various ECCs comprise codes in which each data signal subjected to the ECC should conform to the specific rules of construction of the ECC. Departures from this construction of data (i.e., errors) that are not too great can generally be automatically detected and sometimes corrected. Examples of ECCs include Hamming code, BCH code, Reed-Solomon code, Reed-Muller code, Binary Golay code, Low-Density Parity Code, and Trellis Code modulation. Some ECCs can correct single-bit errors and detect double-bit errors. Other ECCs can detect and/or correct multi-bit errors, for example.

Typically, a memory device will store data (e.g., user data) at a first location in memory and associated error correction code (ECC) data at a second memory location in the memory device. During a read operation, the stored user data and the ECC data are read from the memory array in response to a read request of the user data. Using known algorithms, the user data returned from the read operation is compared to the ECC data. If errors are detected and those errors are within the limits of the ECC, e.g., sufficient ECC resolution exists in the stored ECC data, the errors may be corrected. Such use of ECC for the detection and correction of bit errors is well understood in the art.

For the reasons stated above, and for other reasons stated below which will become apparent to those skilled in the art upon reading and understanding the present specification, there is a need in the art for relieving hosts from performing ECC operations in systems having memory devices.

DETAILED DESCRIPTION

Figure 1:
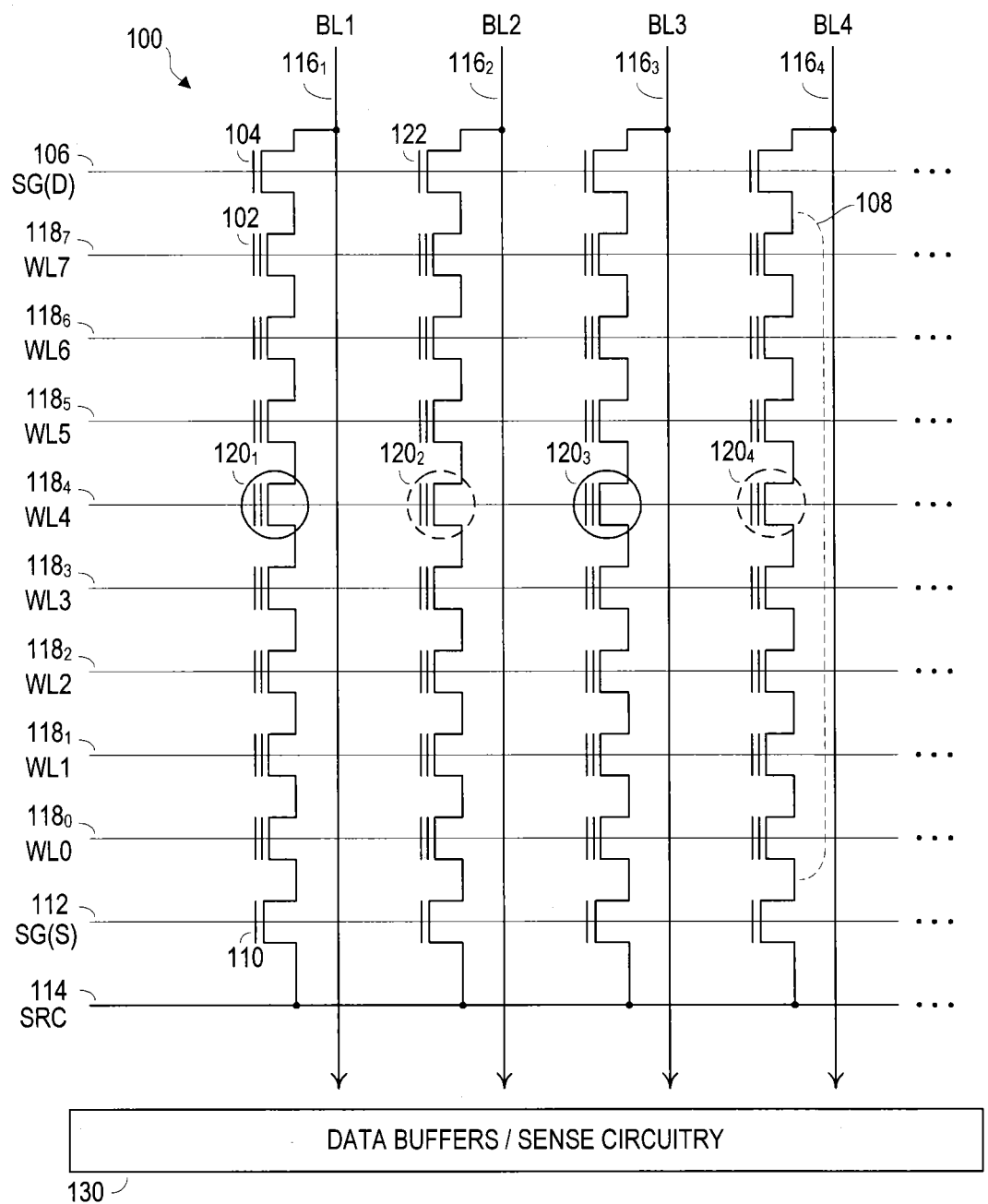
FIG. 1 illustrates a schematic representation of an array of NAND configured memory cells.

In the following detailed description of the invention, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Flash memory typically utilizes one of two basic architectures known as NOR Flash and NAND Flash. The designation is derived from the logic used to read the devices. FIG. 1 illustrates a NAND type flash memory array architecture 100 wherein the memory cells 102 of the memory array are logically arranged in an array of rows and columns. In a conventional NAND Flash architecture, "rows" refers to memory cells having commonly coupled control gates 120, while "columns" refers to memory cells coupled as a particular NAND string 108, for example. A row of memory cells might comprise one or more pages of memory, for example. The memory cells 102 of the array are arranged together in strings (e.g., NAND strings), typically of 8, 16, 32, or more each. Each memory cell of a string are connected together in series, source to drain, between a source line 114 and a data line 116, often referred to as a bit line. The array is accessed by a row decoder (not shown in FIG. 1) activating a logical row of memory cells by selecting a particular access line, often referred to as a word line, such as WL7-WL0 $118_7$-$118_0$, for example. Each word line is coupled to the control gates of a row of memory cells. Data lines, often referred to as bit lines, such as BL1-BL4 $116_{1-4}$ can be driven high or low depending on the type of operation being performed on the array. These bit lines BL1-BL4 $116_{1-4}$ are coupled to sense devices (e.g., sense amplifiers) 130 that detect the state of a target memory cell by sensing voltage or current on a particular bit line 116, for example. As is known to those skilled in the art, the number of word lines and bit lines might be much greater than those shown in FIG. 1.

Memory cells 102 can be configured as what are known in the art as Single Level Memory Cells (SLC) or Multilevel Memory Cells (MLC). SLC and MLC memory cells assign a data state (e.g., as represented by one or more bits) to a specific range of threshold voltages (Vt) stored on the memory cells. Single level memory cells (SLC) permit the storage of a single binary digit (e.g., bit) of data on each memory cell. Meanwhile, MLC technology permits the storage of more than one binary digit per cell (e.g., 2, 4, 8, 16 bits), depending on the quantity of Vt ranges assigned to the cell and the stability of the assigned Vt ranges during the lifetime operation of the memory cell. The number of Vt ranges (e.g., levels), used to represent a bit pattern comprised of N-bits is $2^N$, where N is an integer. For example, one bit may be represented by two ranges, two bits by four ranges, three bits by eight ranges, etc. A common naming convention is to refer to SLC memory as MLC (two level) memory as SLC memory utilizes two Vt ranges in order to store one bit of data as represented by a 0 or a 1, for example. MLC memory configured to store two bits of data can be represented by MLC (four level), three bits of data by MLC (eight level), etc. MLC memory cells may further store fractional bits, e.g., using Vt ranges that are not some power of 2. For example, two memory cells using three Vt ranges can collectively represent nine possible data states, which can represent three bits of data, or 1.5 bits per memory cell.

Figure 2:
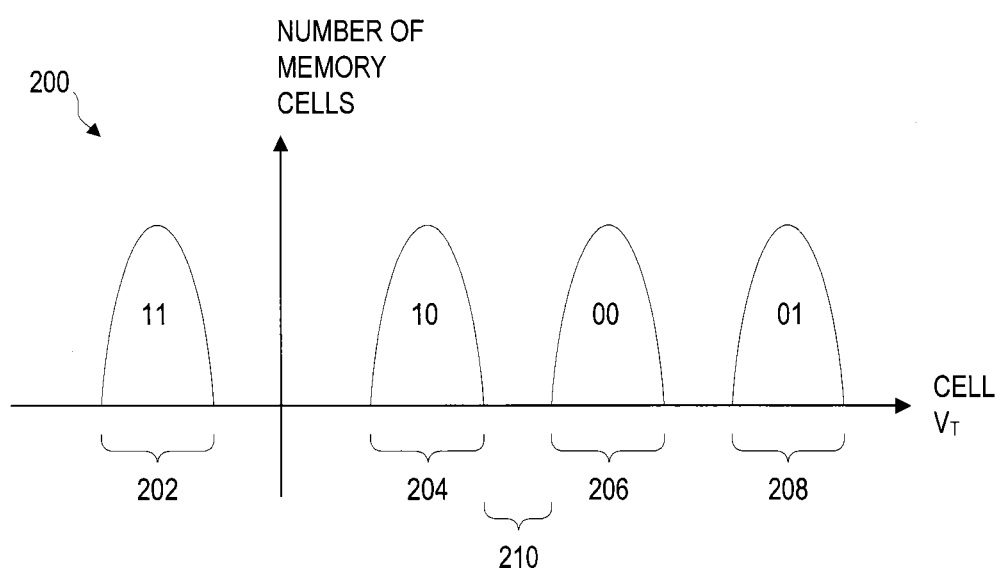
FIG. 2 illustrates a graphical representation of threshold voltage ranges in a population of memory cells.

FIG. 2 illustrates an example of Vt ranges 200 for a MLC (four level) (e.g., 2-bit) memory cell. For example, a memory cell might be programmed to a Vt that falls within one of four different Vt ranges 202-208 of 200 mV, each being used to represent a data state corresponding to a bit pattern comprised of two bits. Typically, a dead space 210 (e.g., sometimes referred to as a margin and may have a range of 200 mV to 400 mV) is maintained between each range 202-208 to keep the ranges from overlapping. As an example, if the voltage stored on a memory cell is within the first of the four Vt ranges 202, the cell in this case is storing a logical '11' state and is typically considered the erased state of the cell. If the voltage is within the second of the four Vt ranges 204, the cell in this case is storing a logical '10' state. A voltage in the third Vt range 206 of the four Vt ranges would indicate that the cell in this case is storing a logical '00' state. Finally, a Vt residing in the fourth Vt range 208 indicates that a logical '01' state is stored in the cell.

Memory cells are typically programmed using erase and programming cycles. For example, memory cells of a particular block of memory cells are first erased and then selectively programmed. For a NAND array, a block of memory cells is typically erased by grounding all of the word lines in the block and applying an erase voltage to a semiconductor substrate on which the block of memory cells are formed, and thus to the channels of the memory cells, in order to remove charges which might be stored on the charge storage structures (e.g., floating gates or charge traps) of the block of memory cells. This typically results in the Vt of memory cells residing in the Vt range 202 (e.g., erased state) of FIG. 2, for example.

Programming typically involves applying one or more programming pulses to a selected word line (e.g., WL4 $118_4$) and thus to the control gate of each memory cell $120_1$-$120_4$ coupled to the selected word line. Typical programming pulses start at or near 15V and tend to increase in magnitude during each programming pulse application. While the program voltage (e.g., programming pulse) is applied to the selected word line, a potential, such as a ground potential, is applied to the substrate, and thus to the channels of these memory cells, resulting in a charge transfer from the channel to the storage structures of memory cells targeted for programming. More specifically, the storage structures are typically charged through direct injection or Fowler-Nordheim tunneling of electrons from the channel to the storage structure, resulting in a Vt typically greater than zero in a programmed state, such as in Vt ranges 204-208 of FIG. 2, for example. In addition, an inhibit voltage is typically applied to bit lines not coupled to a NAND string containing a memory cell that is targeted (e.g., selected) for programming.

Between the application of one or more programming (e.g., Vpgm) pulses, a verify operation is typically performed to check each selected memory cell to determine if it has reached its intended programmed state. If a selected memory cell has reached its intended programmed state it is inhibited from further programming if there remain other memory cells of the selected row still requiring additional programming pulses to reach their intended programmed states. Following a verify operation, an additional programming pulse Vpgm is applied if there are memory cells that have not completed programming. This process of applying a programming pulse followed by performing a verify operation typically continues until all the selected memory cells have reached their intended programmed states. Typically, alternating bit lines are enabled $116_1$, $116_3$ and/or inhibited $116_2$, $116_4$ during a programming (e.g., write) and/or a read operation performed on a selected row of memory cells 120. This is illustrated by the solid and dashed circles shown around memory cells 120, for example. If a particular number of programming pulses (e.g., maximum number) have been applied and one or more selected memory cells still have not completed programming, those memory cells might be marked as defective, for example.

Memory devices, such as NAND Flash memory devices typically utilize what are known as trim values for performing memory operations on a memory array of a memory device, such as a read operation, for example. A minimum read voltage might be designated by a VreadMin trim value and a maximum read voltage might be designated by a VreadMax trim value, for example. These trim values are typically stored in a register in the memory device to define the voltages to be utilized during read operations performed in the memory device. The registers might be loaded with trim values during a boot operation following a reset of the memory device, for example. Other trim values might be utilized, such as verify trim values for performing verify operations, for example.

A potential source of errors in a memory device, such as might result in data corruption, is charge loss from the charge storage structure of memory cells (e.g., floating gates) over some period of time. This typically results in a reduction of the threshold voltages of the affected memory cells. As data stored in the memory cells is represented by the threshold voltage of the memory cells, a change (e.g., drift) of the threshold voltage of a memory cell might be read as storing a different data value than a desired data value that was programmed into it. Sufficient threshold voltage drift in a memory cell (e.g., increasing or decreasing Vt) can eventually cause corruption of data stored in the memory cell, for example.

Figure 3:
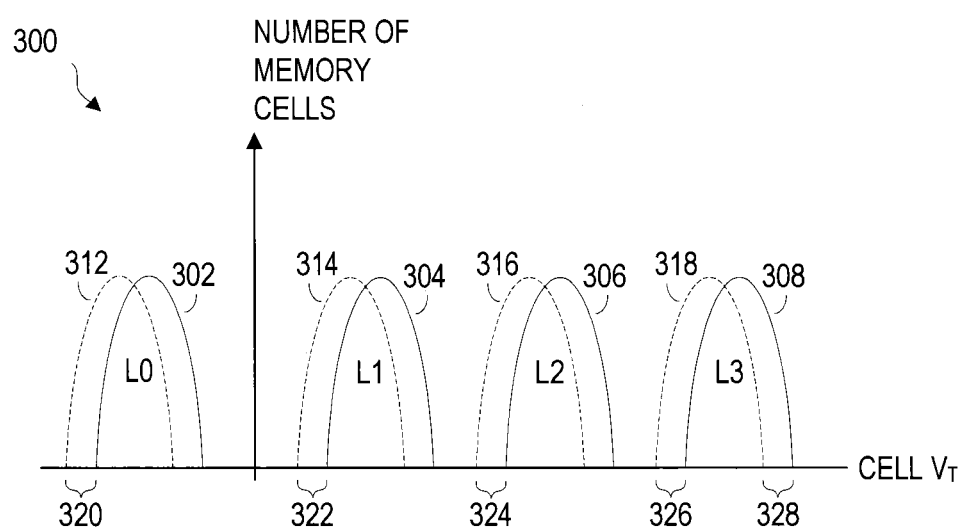
FIG. 3 illustrates another graphical representation of threshold voltage ranges in a population of memory cells.

FIG. 3 illustrates a graphical representation of threshold voltage drift in a population of memory cells. As discussed above, threshold voltage drift might occur as a result of charge loss from a charge storage structure of a memory cell. Threshold voltage drift might occur as a result of various other phenomenon, such as program disturb effects occurring during programming operations performed on the array of memory cells. The distributions of threshold voltages 302-308 of FIG. 3 might correspond respectively to threshold voltage distributions 202-208 discussed above with respect to FIG. 2. Threshold voltage distributions 312-318 illustrate a shift in threshold voltage (e.g., drift) of memory cells. Distribution 306 might be representative of one or more memory cells programmed to level L2 whereas distribution 316 might be representative of a shift in threshold voltage 324 over time of memory cells programmed to level L2. Each shifted threshold voltage distribution 312-318 is shown in FIG. 3 to be shifted 320-328 the same amount from its respective non-shifted distribution 302-308. However, each threshold voltage drift 320-328 might occur in different directions and have different magnitudes than other threshold voltage drift directions and magnitudes than are shown in FIG. 3. Threshold voltage drift 324 might comprise a different magnitude and/or directional shift than threshold voltage drift 322 exhibits. Further, threshold voltage drift 326 might comprise a different magnitude and/or directional drift than threshold voltage drift 328 exhibits. The threshold voltage drift of memory cells programmed to a particular level will not always drift in a uniform direction and/or magnitude.

As discussed above, threshold voltage drift in a memory cell might cause data stored in the memory cell to become corrupted. Distribution 316 represents memory cells whose threshold voltages have shifted 324 by some amount. As long as the memory device can differentiate between threshold voltages of different distributions, such as between distribution 316 and distribution 304, the data read from those memory cells is likely to be reliable. However, if the threshold voltages of a distribution representative of a first programmed level drifts too far so as to overlap with threshold voltages of another distribution representative of a second programmed level, a read operation on these memory cells may yield corrupted data. For example, a memory cell might have been programmed to a desired level L2 having a threshold voltage within the distribution 306. Over some time, the threshold voltages of distribution 306 might drift, such as represented by distribution 316. If the threshold voltages of memory cells represented by distribution 316 drift to threshold voltages levels within distribution 304, the memory cell may be read as if the memory cell had been programmed to level L1 instead of the L2 as programmed. Thus, an error could occur in reading these memory cells.

Figure 4:
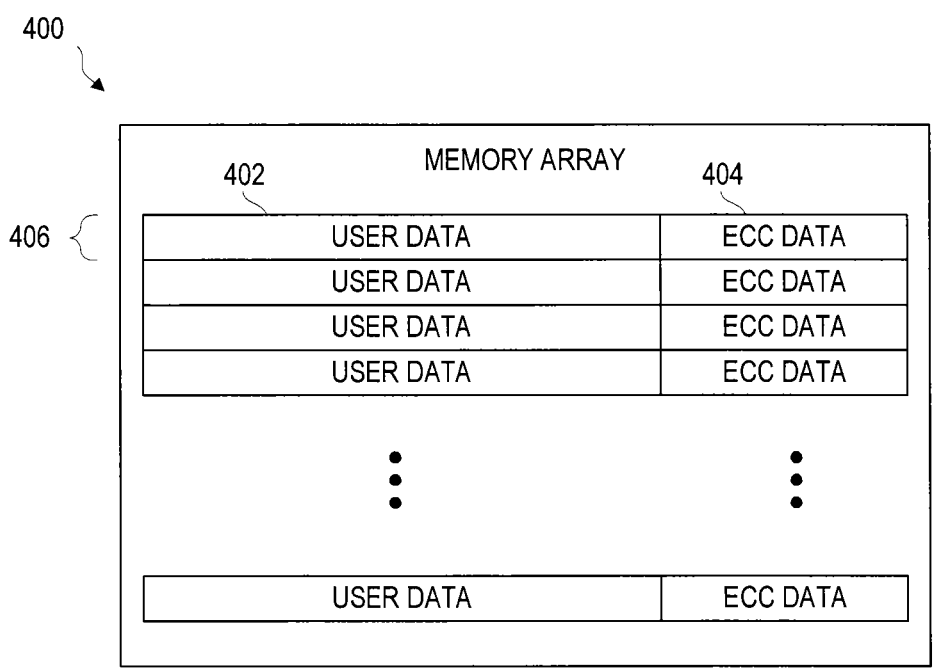
FIG. 4 is a simplified block diagram of a memory array configuration.

Error Correction Code (ECC) methods might be used to attempt to correct one or more errors in data read from a number of memory cells. For example, ECC data corresponding to user data is generated adhering to a particular algorithm by applying the algorithm to the user data to be stored. The user data along with its corresponding ECC data is stored in a memory array of a memory device. FIG. 4 illustrates a representation of a memory array 400 of a memory device, such as an array of Flash memory cells, for example. The user data is stored in memory locations designated to store user data 402 and ECC data is stored in memory locations designated to store ECC data 404. FIG. 4 illustrates each row 406 comprising a user data storage area and an ECC data storage area. For example, the ECC data stored in row 406 might correspond to user data stored in row 406. However, the arrangement of user data storage locations 402 and ECC data storage locations 404 in a memory array might differ from that shown in FIG. 4.

Non-volatile memory devices (e.g., NAND memory) have typically relied on an external memory access device, such as an external controller or processor, to facilitate error correction operations performed on user data read from a memory device. For example, user data along with its corresponding ECC data is read from the memory device and is received by the processor. If an error is detected the processor attempts to perform a corrective operation to attempt to generate corrected user data to be used by the processor. While the processor might have corrected an error, the source of the error has not been corrected. In other words, the processor makes a correction to the user data read from the memory device and then moves on to other operations while the source of the error likely still exists. For example, user data stored in memory cells of a memory device might have become corrupted. The cause of this corruption might continue to occur to a point wherein the corrupted user data might not be correctable using the ECC operations after some point in time. Further, system performance is affected by the processor having to perform the ECC operations to determine if an error has occurred and in attempting to correct any detected errors in user data read from the memory device.

A processor (not shown in FIG. 4) coupled to a memory device, might send a command to the memory device to perform a read operation of a memory location. When the read operation is performed, the requested user data along with its corresponding ECC data is read from the memory array and is sent to the external controller. The ECC data is used to facilitate performing an error check on the corresponding user data read from the memory array. If no errors are detected, the user data is considered accurate. If an error is detected, various ECC operations might be utilized by the external controller to attempt to correct errors detected in the user data detected by the external controller. As discussed above, this places a burden of error checking and error correction on the external controller.

Figure 5:
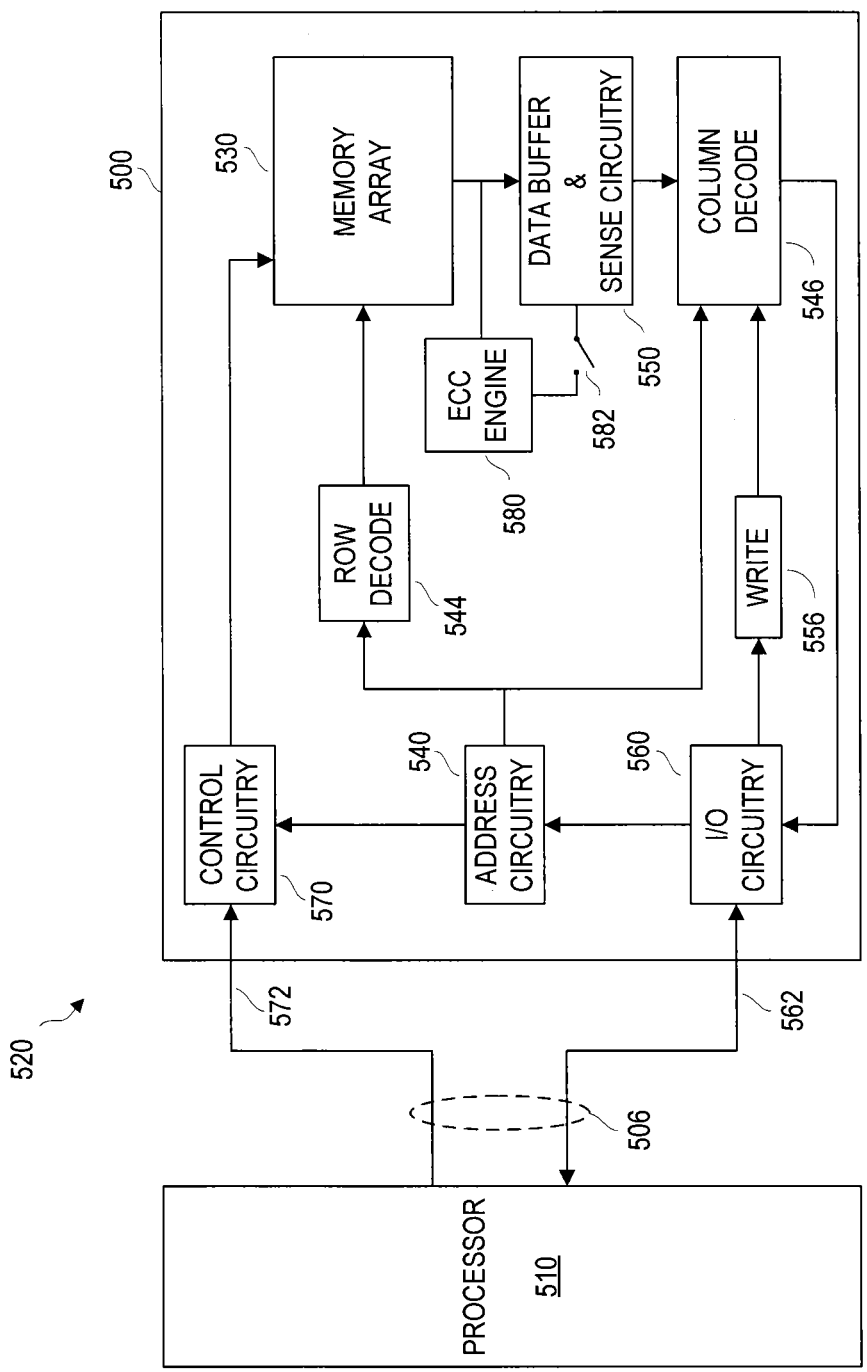
FIG. 5 is a simplified block diagram of a memory device coupled to a memory access device as part of an electronic system according to an embodiment of the present disclosure.

FIG. 5 illustrates a functional block diagram of a memory device 500 according to various embodiments of the present disclosure. The memory device 500 is coupled to an external memory access device 510, such as an external controller as discussed above. The external controller 510 may be a processor or some other type of controlling circuitry. The processor 510 might be configured to perform ECC operations responsive to receiving user data and ECC data read from the memory device as discussed above, for example.

The memory device 500 is coupled to the processor 510 over one or more communications channels 506 (e.g., communications bus.) The communications bus might comprise command, address and/or data signal lines for transmitting signals representing commands, addresses and/or data, respectively. The communications bus might comprise a number of standard interfaces, such as a Universal Serial Bus (USB) interface, for example. The communications bus 506 might be a standard interface used with many hard disk drives (e.g., SATA, PATA) as are known to those skilled in the art. Together, the memory device 500, processor 510 and communications bus 506 form part of an electronic system 520.

The memory device 500 includes one or more arrays of memory cells 530. Memory array 530 might comprise memory such as flash memory and/or phase change memory (PCM.) For example, memory array 530 might comprises an array of NAND configured flash memory cells, such as discussed above with respect to FIG. 1. The one or more memory arrays 530 might comprise 2D and/or 3D memory arrays. The memory array 530 might include multiple banks and blocks of memory cells residing on a single or multiple die as part of the memory device 500. Memory array 530 might comprise SLC and/or MLC memory. The memory array 530 might also be adaptable to store varying densities (e.g., MLC(four-level) and MLC(eight-level)) of data in each memory cell, for example.

Address buffer circuitry 540 is provided to latch address signals provided through I/O circuitry 560. Address signals are received and decoded by a row decoder 544 and a column decoder 546 to access the memory array 530.

The memory device 500 reads memory cells in the memory array 530 by sensing voltage or current changes in the memory array columns using data buffer/sense circuitry 550. The sense circuitry 550, in one embodiment, is coupled to read and latch a row (e.g., page) of data from the memory array 530. Data are input and output through the I/O circuitry 560 for bidirectional data communication as well as the address communication over a plurality of data connections 562 with the processor 510. Write circuitry 556 is provided to write data to the memory array.

Control circuitry 570 decodes signals provided on data connections of a control interface 572 from the external processor 510. These signals are used to control the operations on the memory array 530, including data read, data write (program), and erase operations. The data connections 572 and data connections 562 might be combined, or combined in part to form the communications bus 506 discussed above. The control circuitry 570 may be a state machine, a sequencer, or some other type of control circuitry that is configured to control generation of memory control signals. Control circuitry 570 is configured, at least in part, to facilitate implementing various embodiments of the present disclosure. According to various embodiments, control circuitry 570 is configured to support ECC operations performed internally to the memory device by the ECC engine 580. For example, the ECC engine 580 might be activated or deactivated by the control circuitry as indicated by 582. Control circuitry 570 might further be configured to block access to particular locations in the memory array by the external processor 510 while various operations, such as internal ECC operations are being performed according to one or more embodiments of the present disclosure. The control circuitry 570 and the ECC engine 580, with or without additional circuitry or firmware, may be considered portions of an internal controller.

Control circuitry 570 might be coupled (not shown in FIG. 5) to one or more of the elements of the memory device 500. For example, the control circuitry 570 might be coupled to the row decoder 544 and configured to cause the row decoder driver circuitry to bias particular word lines of the memory array 530. Control circuitry 570 might be coupled (not shown in FIG. 5) to and configured to cause the data buffer and sense circuitry 550 to bias particular bit lines of the array 530. Control circuitry 570 might further comprise one or more register circuits.

The ECC engine 580 of memory device 500 is configured to perform various ECC operations internally to the memory device independent of support or instruction from the processor 510 according to various embodiments of the present disclosure. For example, the ECC engine might be configured to support one or more ECC schemes such as Hamming code, BCH code, Reed-Solomon code, Reed-Muller code, Binary Golay code, Low-Density Parity Code, and Trellis Code modulation methods and algorithms. Selection of which methodology to implement in the ECC engine 580 might be tailored to the technology and/or a desired target reliability level, for example. According to various embodiments, the ECC engine 580 can be configured to facilitate performing an ECC operation on a variety of groupings of memory cells, such as a page and/or a block of memory cells, for example.

ECC engine 580 might be activated or deactivated by control circuitry 570 as indicated by 582. ECC engine 580 is configured to facilitate generating ECC data corresponding to user data to be stored in and/or to be read from the memory array. For example, user data to be stored (e.g., programmed) in the memory array might pass through the ECC engine 580 wherein the ECC engine generates corresponding ECC data to be stored along with the user data. As part of a read operation, user data along with its corresponding stored ECC data might be read from a location in the memory array. The ECC engine is further configured to generate additional ECC data (e.g., ECC test data) corresponding to the user data which was read from the memory location. The ECC engine compares the generated ECC test data with the ECC data stored with the user data when it was stored in the memory array. If the generated ECC test data and the ECC data read from the memory array match, then it is assumed that there are no errors in the user data that was read from the memory array. If a mismatch of the generated ECC test data and the read ECC data occurs, an error is assumed to be present in the user data read from the memory array.

The ECC engine 580 is further configured to perform various ECC algorithms in an attempt to correct an error detected in the user data read from the memory array. According to one or more embodiments, corrected user data might then be stored back in the memory array as facilitated by the internal controller (e.g., ECC engine 580 and/or control circuitry 570). Thus, the memory device 500 is configured with a 'loop back path' to store corrected data (e.g., corrected user data) back to the array from which the corrupted data was read. The ECC engine 580 according to various embodiments of the present disclosure facilitates performing various ECC operations internally to the memory device and absent any direction from an external processor 510, for example. The success of correcting an error can depend on a number of factors. Some errors might not be correctable depending on the type and strength of the ECC algorithms employed by the ECC engine 580.

The memory device illustrated in FIG. 5 has been simplified to facilitate a basic understanding of the features of the memory. A more detailed understanding of internal circuitry and functions of flash memories are known to those skilled in the art.

Figure 6:
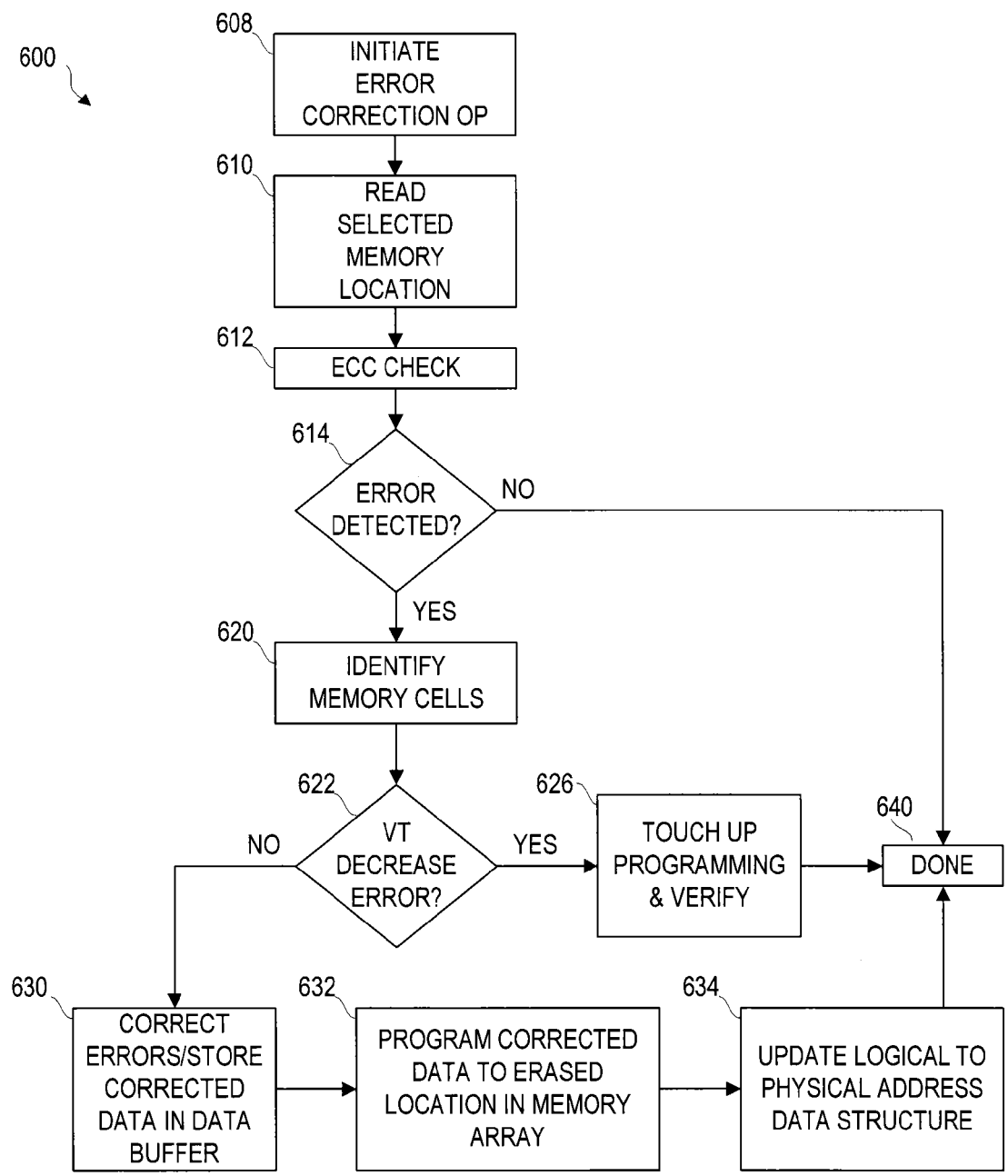
FIG. 6 is a flowchart of a method of performing an error correction operation in a memory device according to an embodiment of the present disclosure.

ECC engine 580 may further be configured to perform various ECC operations in response to various conditions for initiating (e.g., independently initiating) internal ECC operations in the memory device 500. FIG. 6 illustrates a flowchart of performing various internal ECC operations according to one or more embodiments of the present disclosure.

FIG. 6 illustrates initiating an ECC operation 600 (e.g., internal ECC operation) in a memory device. Performing the ECC operation might be facilitated by an internal controller of the memory device, e.g., by control circuitry 570 and/or ECC engine 580 such as discussed above and shown in FIG. 5, for example. A decision to initiate an ECC operation might be made by various methods. An internal ECC operation might be initiated responsive to an instruction received from an external processor 510. Internal ECC operations might be initiated and performed as background operations in the memory device, such as in the absence of an instruction from an external processor 510 to perform an internal ECC operation according to one or more embodiments of the present disclosure.

By way of example, an internal ECC operation according to various embodiments might be initiated by one or both of the ECC engine 580 and control circuitry 570. Internal ECC operations might be performed periodically. For example, ECC operations might be performed responsive to a particular time that has elapsed, such as elapsed time since previously performing internal ECC operations according to various embodiments of the present disclosure. Internal ECC operations might be initiated responsive to an number of memory device operations that have been performed. For example, internal ECC operations might be initiated after a number of programming and/or erase operations have been performed. The frequency of ECC operations can be made at least partially dependent on the type of ECC methodology that is used. Using a stronger ECC algorithm might allow ECC operations to be performed less frequently, for example.

Following the initiation of an ECC operation at 608, memory cells selected to be checked are read at 610 from the memory array to obtain read user data and corresponding read ECC data. Memory cells or groups of memory cells (e.g., blocks of memory cells) might be selected responsive to a number of programming and/or erase operations having been performed on the memory cells. For example, exceeding a number of programming and/or erase operations might identify a group of memory cells to be scheduled for an ECC operation. Memory cells age over time and/or by being exposed to more and more programming/erase cycles. The number of programming pulses needing to complete programming operations on memory cells can be an indication of the age or wear level of those memory cells. Thus, ECC operations might be initiated responsive to a determined age or wear level of memory cells based on tracking the numbers of programming pulses that are needed to complete programming operations on memory cells. For example, an increase in the observed programming characteristics of a group of memory cells (e.g., increase in a number of programming pulses needed to complete programming operations) might be indicative of a wear level of those cells. Thus, ECC operations might be initiated responsive to an indication of a high wear level indication in a group of memory cells, for example. According to one or more embodiments, groups of memory cells might be randomly or sequentially selected for ECC operations.

At 612, the ECC engine 580 processes the read user data and the read ECC data by applying a particular ECC algorithm to the read user data. The ECC engine 580 applies the ECC algorithm to the read user data to generate ECC data (e.g., ECC test data) corresponding to the read user data. The ECC test data is compared to the ECC data read from the memory device and corresponding to the read user data. At 614, a determination is made if an error exists in the read user data responsive to a result of the comparison of the ECC test data and the read ECC data. The ECC operation is concluded at 640 if no error is detected at 614.

A result of the ECC compare operation might indicate that an error exists in the read user data. When an error is indicated, an attempt to identify memory cells contributing to the error (e.g., storing corrupted data) is made at 620. If the errors are within the limits of the ECC, and correction is possible, identification of memory cells contributing to the error is a straightforward task, i.e., those memory cells corresponding to read data to be corrected. According to one or more embodiments, the ECC engine 580 is further configured to determine at 622 if the cause of the detected error was due to threshold voltage drift in one or more memory cells, such as having a threshold voltage which has drifted to a lower level as discussed above with respect to FIG. 3, for example. If the errors are within the limits of the ECC, and correction is possible, determination of the cause of the detected error is a straightforward task. For example, with reference to FIG. 3, if the ECC test data were to indicate that data corresponding to a memory cell should represent an L2 data state, but the read user data corresponding to that memory cell represented an L1 data state (or other lower data state), the cause of the error could be deemed to be the result of a decrease in threshold voltage of that memory cell. Errors deemed to be the result of an increase in threshold voltage of a memory cell could be similarly determined, e.g., where the read user data represents a data state higher than a data state indicated by the ECC test data.

If one or more memory cells are identified as having a reduced threshold voltage, the ECC engine 580 and/or the control circuitry 570, might facilitate performing a programming operation on the identified memory cells at 626 (e.g., touch up programming operation) to increase their threshold voltage levels to restore them to their pre-threshold voltage drift levels. In other words, the touch up programming operation facilitates restoring an amount of charge (e.g., such as without first performing an erase operation) to the charge storage structures of the memory cells such that their threshold voltages again have a level corresponding to their intended (e.g., desired) programmed levels. A verify operation might be performed along with the touch up programming operation at 626 in order to verify that the desired threshold voltage levels for the memory cells have been restored. Thus, according to various embodiments of the present disclosure, a programming operation (e.g., touch up programming operation) is performed on memory cells identified as experiencing reduction in threshold voltage levels responsive to performing an ECC operation. According to further embodiments of the present disclosure, such programming operations might be performed at 626 only if no identified memory cell contributed to the determined error due to an increase in threshold voltage.

Memory cells might be identified during the ECC operation as having threshold voltages which have increased (e.g., increasing threshold voltage drift) to an extent that has resulted in an error of the read user data. The ECC engine 580 might apply an ECC algorithm at 630 to attempt to correct the errors detected in the read user data and generate corrected user data, and the corrected user data may be stored in the memory device, such as in data buffer 550, for example. The ECC engine 580 and/or control circuitry 570 might then facilitate performing a programming operation at 632 to store the corrected user data back into the memory array 530. The corrected user data might be stored in the memory array in a different location than the user data it is replacing. For example, the corrected data might be stored in an erased location of the memory device different from where the corrupted user data was stored in. Alternatively, the control circuitry 570 might facilitate performing an erase operation on the memory location storing the corrupted read user data and subsequently store the corrected user data in the same memory location. According to various embodiments, storing corrected user data might be performed if at least one identified memory cell contributed to the determined error due to an increase in threshold voltage.

According to one or more embodiments, memory device 500 might comprise an address remapping unit which facilitates logical to physical address translation, sometimes referred to as logical to physical address mapping, in the memory device. This data structure provides a correlation between logical addresses and physical addresses located in a memory device. A one to one mapped device might be considered to comprise one physical sector of memory to correspond to one logical sector of memory, for example. A data structure comprising logical to physical address translation information might be stored and maintained in the memory device or alternatively in an external processor. This data structure might be referred to as a Logical to Physical Address Translation Data Structure.

To prevent corruption of data, one or more logical addresses (e.g., range of logical addresses) corresponding to one or more physical addresses of the memory device might be blocked from access except by the memory device control circuitry 570 and/or ECC engine 580 configured to facilitate performing the internal ECC operations. Thus, one or more embodiments facilitate managing access, such as allowing or blocking access, to one or more logical addresses mapped to physical addresses of the memory device while ECC operations are performed internally to the memory device. For example, control circuitry 570 of the memory device might have access to physical addresses in the memory device but a processor 510 coupled to the memory device might not be allowed access while the internal ECC operations are being performed. The memory device might be configured to maintain an output signal, such as a 'ready/busy' (R/B) signal from the memory device. The level (e.g., logic level) of the R/B signal is indicative of whether or not an ECC operation is being performed in the memory device, for example. A R/B signal line might be included (not shown) as part of the communications bus 506 discussed above with respect to FIG. 5, for example Referring again to FIG. 6, if corrected user data is stored in a different memory location than the corrupted read user data, the logical to physical address translation data structure may be updated at 634 to reflect the new location of the corrected user data in memory array. For example, if the logical to physical address translation data structure is maintained in an external processor 510, the memory device 500 might send updated address information to the external processor 510 so that the logical to physical address translation structure can be updated with the new physical address of the corrected user data. A logical to physical address translation data structure maintained in the memory device 500 might be updated internally to the memory device in response to identifying a new physical location in the memory device to store the corrected user data, for example.

It is noted that according to one or more embodiments, the logical to physical address translation data structure might not need to be updated following the touch up programming operation at 626 because the location of the user data in the memory device has not changed. Further, one or more embodiments might comprise the ECC operation illustrated by FIG. 6 to be performed again following the completion of a first iteration of performing the ECC operation. For example, subsequent to performing the touch up programming operation at 626 and/or programming the corrected user data to the memory array at 632, the ECC operation described by FIG. 6 might be performed again so as to verify the previously performed ECC operation was completed successfully.

Figure 7:
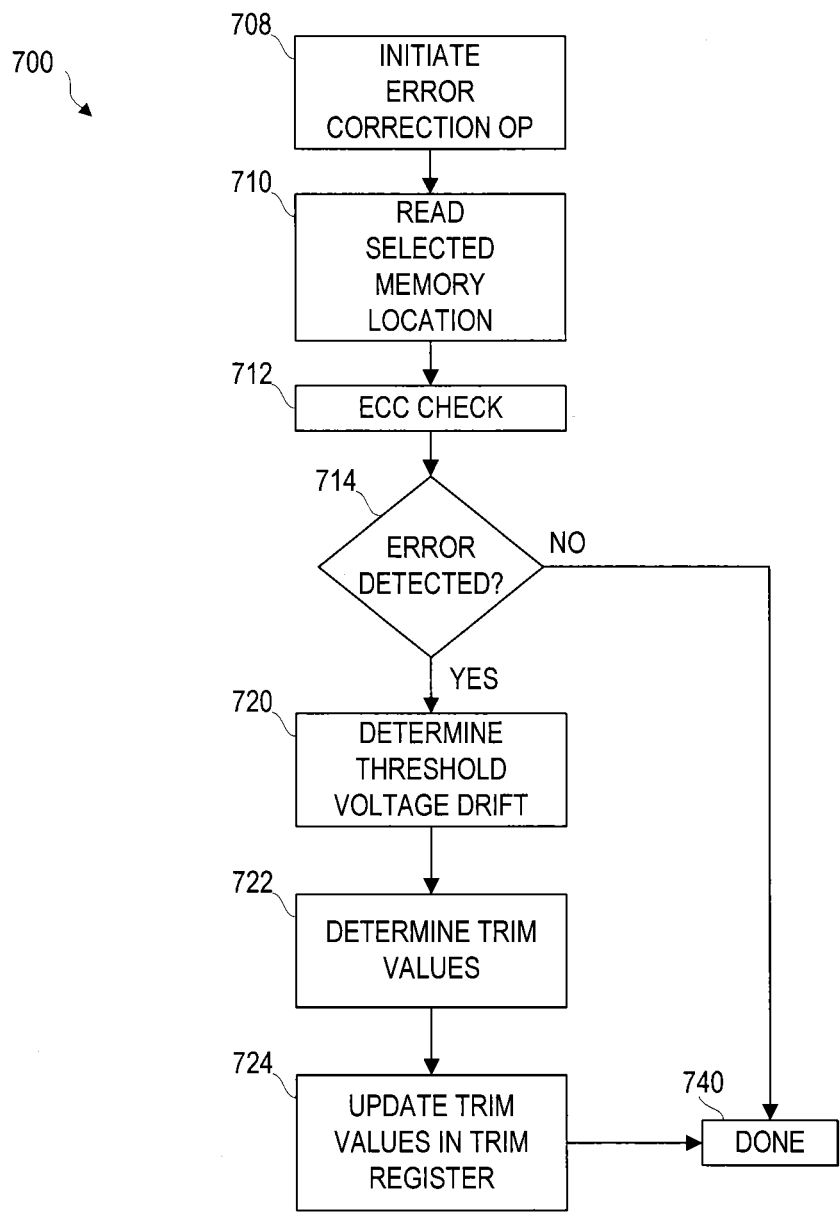
FIG. 7 is a flowchart of another method of performing an error correction operation in a memory device according to an embodiment of the present disclosure.

FIG. 7 illustrates a flowchart of performing another internal ECC operation according to one or more embodiments of the present disclosure. The method illustrated by FIG. 7 is similar to that shown in FIG. 6 and discussed above. An ECC operation is initiated at 708 such as discussed above with respect to step 608 of FIG. 6. User data and ECC data are read from selected memory cells at 710 such as discussed above with respect to step 610. At 712, an ECC check is performed on the read user data, such as discussed above with respect to step 612 of FIG. 6. The ECC engine 580 determines if an error exists in the read user data at 714. If no error is detected, the ECC operation is complete at 740.

If an error is detected at 714, the ECC engine 580 is configured to determine a magnitude and/or direction of shifts in threshold voltages of a number of the selected memory cells. Responsive to the threshold voltage shift determination, the ECC engine attempts to determine (e.g., determine and adjust) trim values at 722 which, if utilized, might correct the errors detected during the ECC check. For example, the threshold voltage drifts might have occurred in the same direction and with substantially the same magnitude. Thus, according to one or more embodiments of the present disclosure, an adjustment to the trim values used during read operations (e.g., VreadMin and/or VreadMax) might be adjusted to compensate for the threshold voltage shifts determined by the ECC engine 720. These adjusted trim values might be stored in the trim registers of the memory device at 724, such as discussed above, to be utilized during subsequent read operations performed on the selected memory cells, for example.

CONCLUSION

Error correction operations in memory devices have been described. In particular, methods of performing error correction operations within the memory device independent of an instruction from an external memory access device coupled to the memory device have been discussed. Independent error correction operations might be managed by internal memory device control circuitry configured to initiate and facilitate performing error correction operations in the memory device to identify and correct errors and to store a corrected version of data in the memory device. Adjusting trim values responsive to performing ECC operations in the memory device have also been disclosed.

Although specific embodiments have been illustrated and described herein, it will be appreciated by those of ordinary skill in the art that any arrangement, which is calculated to achieve the same purpose, may be substituted for the specific embodiments shown. Many adaptations of the disclosure will be apparent to those of ordinary skill in the art. Accordingly, this application is intended to cover any adaptations or variations of the disclosure.

What is claimed is:

1. A method of operating a memory device, the method comprising:

performing an error correction code (ECC) operation on user data stored in a first portion of a memory array of the memory device;

determining if an error exists in the user data stored in the first portion of the memory array responsive to performing the ECC operation; and if an error is determined to exist:

applying one or more programming pulses to memory cells of the first portion of the memory array if a memory cell of the first portion of the memory array contributed to the determined error due to a decrease in threshold voltage;

wherein applying the one or more programming pulses to memory cells of the first portion of the memory array comprises applying the one or more programming pulses to memory cells in which the user data is stored.

2. The method of claim 1, wherein performing the error correction code (ECC) operation further comprises performing the error correction code (ECC) operation independently from an instruction received from an external memory access device coupled to the memory device.

3. The method of claim 2, wherein performing the error correction code (ECC) operation independently from an instruction received from an external memory access device further comprises performing the error correction code (ECC) operation in response to a command generated by an internal controller of the memory device.

4. The method of claim 1, further comprising inhibiting one or more of the memory cells of the first portion of the memory array from programming while applying the one or more programming pulses to the memory cells of the first portion of the memory array.

5. The method of claim 1, wherein applying the one or more programming pulses to the memory cells of the first portion of the memory array further comprises performing a touch up programming operation on one or more of the memory cells of the first portion of the memory array that contributed to the determined error to increase the threshold voltage of each of the one or more of the memory cells towards a respective desired threshold voltage of each of the one or more of the memory cells.

6. The method of claim 1, wherein applying the one or more programming pulses to the memory cells of the first portion of the memory array further comprises applying the one or more programming pulses to the memory cells of the first portion of the memory array only when no memory cell of the first portion of the memory array contributed to the determined error due to an increase in threshold voltage.

7. A method of operating a memory device, the method comprising:
performing an error correction code (ECC) operation on user data stored in a first portion of a memory array of the memory device;
determining if an error exists in user data stored in the first portion of the memory array responsive to performing the ECC operation; and
if an error is determined to exist:
applying one or more programming pulses to memory cells of the first portion of the memory array if a memory cell of the first portion of the memory array contributed to the determined error due to a decrease in threshold voltage and no memory cell of the first portion of the memory array contributed to the determined error due to an increase in threshold voltage; and
generating corrected user data and storing the corrected user data in a second portion of the memory array if at least one memory cell of the first portion of the memory array contributed to the determined error due to an increase in threshold voltage of the at least one memory cell.

8. The method of claim 7, further comprising updating a logical to physical address translation data structure in response to storing the corrected user data in the second portion of the memory array if the second portion of the memory array has a different physical address than the first portion of the memory array.

9. The method of claim 8, wherein updating further comprises updating by sending an address of the second portion of the memory array to an external memory access device coupled to the memory device, where the external memory access device is configured to maintain the logical to physical address translation data structure.

10. The method of claim 9, wherein the address of the second portion of the memory array is sent to the external memory access device by the memory device in the absence of a request from the external memory access device to update the logical to physical address translation data structure.

11. The method of claim 8, wherein updating further comprises updating the logical to physical address translation data structure in an internal controller of the memory device.

12. The method of claim 7, wherein storing the corrected user data in a second portion of the memory array comprises erasing the first portion of the memory array and storing the corrected user data in the erased first portion of the memory array.

13. The method of claim 1, wherein the first portion of the memory array comprises either a page of memory cells or a block of memory cells of the memory array.

14. The method of claim 1, wherein the error correction code comprises one of a Hamming code, BCH code, Reed-Solomon code, Reed-Muller code, Binary Golay code, Low-Density Parity Code, and Trellis Code modulation.

15. A method of operating a memory device, the method comprising:
reading user data and error correction code (ECC) data corresponding to the user data;
generating additional error correction code (ECC) data from the read user data;
comparing the generated ECC data to the read ECC data to determine if the read user data comprises an error;
if the read user data is determined to comprise an error:
determining which memory cells storing the read user data contributed to the error;
applying one or more programming pulses to the memory cells determined to have contributed to the error if each of the memory cells contributed to the error due to a reduction in a threshold voltage; and
generating corrected user data and storing the corrected user data in a second memory location when at least one of the memory cells is determined to have contributed to the error due to an increase in threshold voltage.

16. A method of operating a memory device, the method comprising:
performing a read operation in the memory device to read user data from a plurality of memory cells of an array of memory cells utilizing a plurality of trim values that define particular voltages to be utilized during the read operation;
determining if the read user data comprises an error;
adjusting one or more trim values of the plurality of trim values in response to determining that the read user data comprises an error; and
storing the adjusted one or more trim values of the plurality of trim values to the memory device, wherein the plurality of trim values including the adjusted one or more trim values of the plurality of trim values define voltages to be utilized during a subsequent read operation in the memory device that are different than the particular voltages;
wherein reading the user data and determining if the read user data comprises an error is performed without an instruction received from an external memory access device.

17. The method of claim 16, wherein the adjusted one or more trim values of the plurality of trim values comprise one or more read operation trim values.

18. The method of claim 17, wherein the one or more read operation trim values comprise at least one trim value selected from a group consisting of a trim value corresponding to a minimum read voltage and a trim value corresponding to a maximum read voltage.

19. The method of claim 16, wherein performing the read operation to read the user data and determining if the read user data comprises an error is performed in response to a command generated by an internal controller of the memory device.

20. The method of claim 19, wherein performing the read operation to read the user data and determining if the read user data comprises an error is performed periodically in response to the internal controller periodically generating the command.

21. The method of claim 16, wherein determining if the read user data comprises an error comprises performing an error correction code (ECC) operation, and wherein the ECC operation uses an ECC code comprising one of a Hamming code, BCH code, Reed-Solomon code, Reed-Muller code, Binary Golay code, Low-Density Parity Code, and Trellis Code modulation.

22. A memory device, comprising:
a memory device interface;
an array of memory cells;
an internal controller comprising an error correction code (ECC) engine, wherein the internal controller is configured to:
perform a read operation of user data stored in a first memory location of the array of memory cells;
determine if the read user data comprises an error, and determine which memory cells storing the read user data contributed to an error when the read user data comprises an error;
if the read user data is determined to comprise an error:
apply one or more program pulses to the memory cells storing the read user data if each of the memory cells storing the read user data and determined to have contributed to the error contributed to the error due to a reduction in a threshold voltage; and
generate corrected user data and store the corrected user data in a second memory location of the array of memory cells when at least one of the memory cells storing the read user data is determined to have contributed to the error due to an increase in threshold voltage.

23. The memory device of claim 22, wherein the internal controller further comprises control circuitry.

24. The memory device of claim 23, wherein the control circuitry is configured to activate and deactivate the ECC engine.

25. The memory device of claim 24, wherein the control circuitry is further configured to periodically activate the ECC engine.

26. The memory device of claim 24, wherein the control circuitry is configured to activate the ECC engine independently from instructions received at the memory device interface from an external memory access device.

27. The memory device of claim 23, wherein the control circuitry is configured to maintain a logical to physical address translation data structure.

28. The memory device of claim 27, wherein the control circuitry is further configured to update the logical to physical address translation data structure with an address corresponding to the second memory location of the array of memory cells in response to storing the corrected user data in the second memory location if the second portion of the array of memory cells has a different physical address than the first portion of the array of memory cells.

29. The memory device of claim 23, wherein the control circuitry is configured to transmit an address of the second memory location of the array of memory cells to an external memory access device coupled to the memory device interface in response to storing the corrected user data in the second memory location of the array of memory cells if the second portion of the array of memory cells has a different physical address than the first portion of the array of memory cells.

30. The memory device of claim 22, wherein the ECC engine is configured to perform the ECC operation corresponding to an ECC code comprising one of a Hamming code, BCH code, Reed-Solomon code, Reed-Muller code, Binary Golay code, Low-Density Parity Code, and Trellis Code modulation.

31. The memory device of claim 22, wherein the array of memory cells comprises an array of Flash memory cells.

32. The memory device of claim 22, wherein the array of memory cells comprises one of a 2-Dimensional array of memory cells or a 3-Dimensional array of memory cells.

33. A memory device, comprising:
a memory device interface for communication with an external memory access device;
an array of memory cells;
an internal controller connected to the memory device interface and comprising an error correction code (ECC) engine, wherein the internal controller, independent of an instruction received from the memory device interface, is configured to:
perform a read operation to read user data from a plurality of memory cells of the array of memory cells utilizing a plurality of trim values that define particular voltages to be utilized during the read operation;
determine if the read user data comprises an error;
adjust one or more trim values of the plurality of trim values in response to a determination that the read user data comprises an error; and
store the adjusted one or more trim values of the plurality of trim values to the memory device, wherein the plurality of trim values including the adjusted one or more trim values of the plurality of trim values define voltages to be utilized during a subsequent read operation performed by the internal controller that are different than the particular voltages.

34. The memory device of claim 33, wherein the adjusted one or more trim values of the plurality of trim values comprise one or more read operation trim values.

35. The memory device of claim 34, wherein the one or more read operation trim values comprise at least one trim value selected from a group consisting of a trim value corresponding to a minimum read voltage and a trim value corresponding to a maximum read voltage.

36. The memory device of claim 33, further comprising a plurality of registers, where the internal controller is further configured to store the adjusted one or more trim values of the plurality of trim values in one or more registers of the plurality of registers.

37. The memory device of claim 33, wherein the internal controller further comprises control circuitry.

38. The memory device of claim 37, wherein the control circuitry is configured to activate and deactivate the ECC engine.

39. The memory device of claim 37, wherein the control circuitry is configured to generate an ECC operation command and where an ECC operation is performed in response to the generated ECC operation command.

40. The memory device of claim 39, wherein control circuitry is further configured to periodically generate the ECC operation command.

41. The memory device of claim 33, wherein the internal controller is configured to determine if the read user data comprises an error by performing an error correction code (ECC) operation, and wherein the ECC operation uses an ECC code comprising one of a Hamming code, BCH code, Reed-Solomon code, Reed-Muller code, Binary Golay code, Low-Density Parity Code, and Trellis Code modulation.

* * * * *